(12) United States Patent
Vimercati

(10) Patent No.: US 7,054,197 B2
(45) Date of Patent: May 30, 2006

(54) METHOD FOR READING A NONVOLATILE MEMORY DEVICE AND NONVOLATILE MEMORY DEVICE IMPLEMENTING THE READING METHOD

(75) Inventor: Daniele Vimercati, Carate Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/820,458

(22) Filed: Apr. 8, 2004

(65) Prior Publication Data
US 2004/0257876 A1 Dec. 23, 2004

(30) Foreign Application Priority Data
Apr. 10, 2003 (EP) ................................. 03425224

(51) Int. Cl.
*G11C 16/04* (2006.01)
*G11C 16/06* (2006.01)

(52) U.S. Cl. ........................... 365/185.18; 365/185.19; 365/365; 365/185.2

(58) Field of Classification Search ........... 365/185.03, 365/185.19, 185.2, 185.21, 185.33, 185.18, 365/185.29, 185.3
See application file for complete search history.

(56) References Cited

U.S. PATENT DOCUMENTS

| | | | |
|---|---|---|---|
| 5,508,958 A * | 4/1996 | Fazio et al. ............. | 365/185.19 |
| 5,596,532 A * | 1/1997 | Cernea et al. .......... | 365/185.33 |
| 5,936,906 A | 8/1999 | Tsen | |
| 5,963,462 A * | 10/1999 | Engh et al. ............. | 365/185.19 |
| 6,009,040 A | 12/1999 | Choi et al. | |
| 6,038,166 A * | 3/2000 | Wong ..................... | 365/185.21 |
| 6,157,572 A * | 12/2000 | Haddad et al. ......... | 365/185.33 |
| 6,275,417 B1 * | 8/2001 | Lee et al. ............... | 365/185.03 |
| 6,339,548 B1 * | 1/2002 | Hazama ................. | 365/185.21 |
| 6,385,110 B1 | 5/2002 | Deguchi | |
| 6,456,527 B1 * | 9/2002 | Campardo et al. ..... | 365/185.03 |
| 2001/0006480 A1 | 7/2001 | Sato | |

FOREIGN PATENT DOCUMENTS

EP 0 999 698 A2 5/2000

OTHER PUBLICATIONS

European Search Report from French Patent Application 03425224.7, filed Apr. 10, 2003.
Amin A A M: "Design And Analysis Of A High-Speed Sense Amplifier For Single-Transistor Nonvolatile Memory Cells" IEE Proceedings G. Electronic Circuits & Systems, Institution of Electrical Engineers. Stevenage, GB, vol. 140, No. 2 Part G, Apr. 1, 1993, pp. 117-122.

* cited by examiner

*Primary Examiner*—Trong Phan
(74) *Attorney, Agent, or Firm*—Lisa K. Jorgenson; James H. Morris; Wolf, Greenfield & Sacks, P.C.

(57) ABSTRACT

A reading method for a nonvolatile memory device, wherein the gate terminals of the array memory cell and of the reference memory cell are supplied with a same reading voltage having a ramp-like pattern, so as to modify their current-conduction states in successive times, and the contents of the array memory cell are determined on the basis of the modification order of the current-conduction states of the array memory cell and of the reference memory cell.

19 Claims, 7 Drawing Sheets

METHOD FOR READING A NONVOLATILE MEMORY DEVICE AND NONVOLATILE MEMORY DEVICE IMPLEMENTING THE READING METHOD

BACKGROUND OF THE INVENTION

1. Field of the Invention

The present invention relates to a method for reading a nonvolatile memory device and to a nonvolatile memory device implementing the reading method.

2. Discussion of the Related Art

As is known, in nonvolatile memory cells of the floating-gate type, a logic state is stored by programming the threshold voltage of the memory cells through the definition of the amount of electrical charge stored in the floating-gate region.

Thanks to the evolution of technological processes, allowing the implementation of elementary memory devices of increasingly smaller size, in the last few years semiconductor memory devices having very high memory capacities have been obtained. A further increase in the memory capacity has been obtained by resorting to multilevel storage, which enables an increase in the memory density for the same technological generation. In fact, with this technique, more information bits are stored within a individual memory cell normally used for containing just one bit.

Although based on the same principle, writing and reading of memory cells capable of storing just one bit (two-level memory cells) and of memory cells capable of storing more than one bit (multilevel memory cells) are performed according to different modalities.

In particular, according to the information stored, two-level memory cells are distinguished between erased memory cells (logic value stored "1"), wherein the floating-gate region does not store any electrical charge, and written or programmed memory cells (logic value stored "0"), wherein the floating-gate region stores an electrical charge sufficient for determining a sensible increase in the threshold voltage of the memory cells.

Reading of two-level memory cells is performed by comparing an electrical quantity correlated to the current flowing through the memory cells with a similar electrical quantity correlated to the current flowing through a reference memory cell of known contents. In particular, to read a two-level memory cell, the gate terminal of the memory cell is fed with a reading voltage having a value comprised between the threshold voltage of an erased memory cell and the threshold voltage of a written memory cell, so that, if the memory cell is written, the reading voltage is lower than its threshold voltage and consequently no current flows in the memory cell, while if the memory cell is erased, the reading voltage is higher than its threshold voltage and current flows in the cell.

In multilevel memory cells, storage of n-bit data requires, instead, programming of threshold voltages that may assume $2^n$ different values, each associated with a respective n-bit datum, while reading of multilevel memory cells is performed by comparing an electrical quantity correlated to the current flowing through the memory cells with $2^n$ distinct reference intervals (defined by $2^{n-1}$ distinct reference levels), each associated with a respective n-bit datum, and then by determining the datum associated with the range of values within which the electrical quantity is comprised.

The multilevel approach may be applied both to volatile memories (such as DRAMs) and to nonvolatile memories (such as EEPROMs and flash memories). In any case, the increase in the number of bits per memory cell renders more critical the tolerance to disturbance, retention of information, and accuracy of reading and writing operations.

FIG. 1 shows, for example, a graph representing the current flowing $[(I[\mu A]), (0-70\,\mu A)]$ in a multilevel memory cell storing two bits and the reference currents defining reference intervals used for reading the contents of the memory cell.

In particular, FIG. 1 shows with dashed line the current $I_{CELL}$ flowing in a memory cell storing the bits "10", and a solid line represents the three reference currents $I_{REF1}$, $I_{REF2}$, $I_{REF3}$ that define the four reference intervals. FIG. 1 also represents the two bits associated with each of the four reference intervals and, with a dashed-and-dotted line, the current flowing in a virgin cell, which, as known, is higher than the highest reference current ($I_{REF3}$).

It is likewise known that reading of a memory cell is performed by a read circuit generally known as "sense amplifier" (also used hereinafter), which, in addition to recognizing the logic state stored in the memory cell, also provides for correct biasing of the drain terminal of the memory cell.

Basically, two types of sense amplifiers are used for reading multilevel memory cells: sense amplifiers of so-called parallel or flash type, and sense amplifiers of so-called synchronous-serial-dichotomic or successive-approximations type.

FIG. 2 illustrates, by way of example, the circuit architecture of a known sense amplifier of parallel type for reading a two-bit memory cell.

In particular, in sense amplifiers of parallel type, reading of the contents of the memory cell is performed by comparing the cell current $I_{CELL}$ simultaneously with the three reference currents $I_{REF1}$, $I_{REF2}$, $I_{REF3}$ using three distinct comparator stages operating in parallel, one for each reference current, the outputs whereof are connected to a decoding stage supplying the two bits stored in the memory cell to be read according to the logic level assumed by the outputs of the comparator stages.

FIG. 3, instead, shows the dichotomic algorithm implemented by sense amplifiers of synchronous-serial-dichotomic type for reading the contents of a multilevel memory cell storing two bits, while FIG. 4 illustrates the circuit architecture of a known sense amplifier of a synchronous-serial-dichotomic type.

In particular, as illustrated in FIG. 3, in sense amplifiers of synchronous-serial-dichotomic type, reading of the contents of the memory cell, in the example shown consisting again of the bits "10", is performed in two temporally consecutive steps, referred to as dichotomic steps, one for each of the two bits to be read, wherein in the first dichotomic step the current $I_{CELL}$ flowing in the memory cell is compared with the reference current $I_{REF2}$, the value whereof is intermediate between the values assumed by the other reference currents, while in the second dichotomic step the current $I_{CELL}$ flowing in the memory cell is compared with the reference current $I_{REF1}$ or IREF3 according to the outcome of the comparison performed in the first dichotomic step. In particular, if in the first dichotomic step the current $I_{CELL}$ is higher than the reference current $I_{REF2}$, then in the second dichotomic step the current $I_{CELL}$ is compared with the reference current $I_{REF3}$, while if in the first dichotomic step the current $I_{CELL}$ is lower than the reference current $I_{REF2}$, then in the second dichotomic step the current $I_{CELL}$ is compared with the reference current $I_{REF1}$.

In each dichotomic step, one of the two bits is then decoded; in particular, in the first dichotomic step the most significant bit (MSB) is decoded, while in the second dichotomic step the least significant bit (LSB) is decoded.

As shown in FIG. 4, in sense amplifiers of synchronous-serial-dichotomic type, reading of the contents of the memory cell is performed using a single comparator stage which, in the first dichotomic step, compares the cell current $I_{CELL}$ with the reference current $I_{REF2}$, and, in the second dichotomic step, compares the current $I_{CELL}$ with the reference current $I_{REF1}$ or $I_{REF3}$ according to the outcome of the comparison in the first dichotomic step.

In particular, the selection of the reference current $I_{REF1}$, $I_{REF2}$, $I_{REF3}$ to be compared with the cell current $I_{CELL}$ is performed through a multiplexer stage controlled by a control circuit, which is also connected to two registers or latches storing the two bits read.

Although widely used, sense amplifiers of parallel type and sense amplifiers of synchronous-serial-dichotomic type have a number of drawbacks that do not enable an adequate exploitation of all their qualities.

First, both sense amplifiers of parallel type and sense amplifiers of synchronous-serial-dichotomic type are very bulky.

In fact, sense amplifiers of parallel type require a comparator stage for each of the bits stored in the memory cells, which, as is known, occupies a non-negligible area, so that the use of this type of sense amplifier becomes in effect disadvantageous as the number of bits stored in the memory cells increases.

Sense amplifiers of synchronous-serial-dichotomic type, although using just one comparator stage, require registers for storing the bits read in each dichotomic step, a multiplexer stage, and a control stage. In addition, this type of sense amplifier requires an accurate management of the various dichotomic steps so that the circuit complexity of the control stage, and hence its bulk, increases significantly as the number of bits stored in the memory cells increases.

In addition, in sense amplifiers of synchronous-serial-dichotomic type, all the various dichotomic steps have a same temporal duration which is established a priori for the so-called worst case, i.e., to enable reliable reading of a bit even in case of simultaneous occurrence of all the operating conditions that determine a slowing-down of reading (low supply voltage, high capacitances to be charged/discharged, etc.); furthermore the dichotomic steps are synchronized with each other, i.e., a dichotomic step starts after a pre-set time interval from the start of the previous dichotomic step, irrespective when the first comparator stage has actually terminated the comparison between the cell current $I_{CELL}$ and the reference current $I_{REF2}$.

For the above reasons, the reading speed of synchronous-serial-dichotomic sense amplifiers is not very high; in particular, the total time for reading the contents of a nonvolatile memory cell has on average, in this type of sense amplifier, rather high values of the order of 20–25 ns, which, in some applications, is not acceptable.

To trade off, in a better way as compared to the sense amplifiers described above, the contrasting needs of small area and high reading speed, U.S. patent application Ser. No. 10/118,660, filed Apr. 8, 2002, published as US2002/0186592, which is incorporated herein by reference, teaches a sense amplifier of the asynchronous-serial-dichotomic type, the circuit architecture whereof is illustrated in FIG. 5 in the case of reading of two-bit memory cells.

In particular, the sense amplifier is basically made up of a first and a second comparator, and a two-way multiplexer for selecting the reference current with which the cell current must be compared in the second dichotomic step.

Reading of the contents of the memory cell is performed in two dichotomic steps similarly to what described previously with reference to sense amplifiers of the synchronous-serial-dichotomic type, except that the two dichotomic steps are asynchronous to each other.

In particular, in the first dichotomic step, the cell current $I_{CELL}$ is compared with the reference current $I_{REF2}$, while in the second dichotomic step, the cell current $I_{CELL}$ is compared with the reference current $I_{REF1}$ if the cell current $I_{CELL}$ is lower than the reference current $I_{REF2}$, or with the reference current $I_{REF3}$ if the cell current $I_{CELL}$ is higher than the reference current $I_{REF2}$.

One of the two bits is decoded in each dichotomic step; in particular, in the first dichotomic step the most significant bit (MSB) is decoded, while in the second dichotomic step the least significant bit (LSB) is decoded.

In addition, the second dichotomic step starts as soon as the comparison between the cell current $I_{CELL}$ and the reference current $I_{REF2}$ is terminated, contrary to sense amplifiers of the synchronous-serial-dichotomic type wherein, due to the duration of each dichotomic step being established a priori for the worst case, the second dichotomic step starts after a preset time interval from the start of the first dichotomic step, irrespective of when the first comparator stage has terminated the comparison between the cell current $I_{CELL}$ and the reference current $I_{REF2}$.

This enables a significant reduction in the reading time as compared to the sense amplifiers of the synchronous-serial-dichotomic type. In fact, the average time for reading the contents of a two-bit memory cell is reduced from 70 ns of a synchronous-serial-dichotomic sense amplifier to 50 ns. It can thus be immediately understood how the benefits in terms of reduction of the reading time become increasingly more significant, as compared to synchronous-serial-dichotomic sense amplifiers, the higher the number of bits stored in the memory cells.

Not only, but an asynchronous configuration, using a comparator stage for each dichotomic step, also enables saving of silicon area, which, in a synchronous configuration, is occupied by the control circuit and by the registers.

Notwithstanding the considerable improvements achieved, reading of multilevel memory cells continues in any case in general to be afflicted by a series of problems linked essentially to the intrinsic characteristics of the memory device in general and of the memory cells in particular.

A first of such problems is, for example, represented by the so-called apparent displacement of the distributions of the threshold voltages of the memory cells caused by the datum to be read.

In particular, it has been verified that in multilevel memory cells the outcome of reading a datum stored in a block of memory cells belonging to a same sector may also depend, to a non-negligible extent, upon the datum itself; i.e., the reading of the contents of a given memory cell is influenced by the reading of the contents of the adjacent memory cells, and this influence is particularly significant in multilevel memory cells, so much so as possibly to lead to reading errors.

As known, in fact, in nonvolatile memory devices, the memory array is generally divided into sectors, each of which is made up of a group of memory cells having source terminals connected to a common node to enable reading and programming of individual memory cells of the sector and simultaneous erasing of all the memory cells of the sector.

With this architecture, the voltage on the common node connected to the source terminals of all the memory cells belonging to a same sector depends upon the current drained by the memory cells being read, so that, given that the outcome of the reading of the contents of a memory cell depends to a significant extent upon the voltage present on its own source terminal, the variation that the voltage present on the common node can undergo according to the datum that is being read may lead to errors in reading the contents of a memory cell.

A further problem is linked to the way the references necessary for reading are generated.

In particular, in order to prevent any mismatch between the sense amplifiers, two architectures for generation of the references are used alternatively: a centralized one and a local one.

The centralized reference-generation architecture, illustrated schematically in FIG. 6 in the case of multilevel memory cells that store two bits, envisages basically that the three reference currents supplied to each of the sense amplifiers are obtained by mirroring an equal number of reference currents generated by a suitable reference generating circuit. This solution, albeit with the minor generation errors, entails, however, the use of current mirrors made up of transistors of rather large size, so that this solution has the biggest bulk and a current consumption proportional to the size of the transistors for charging the capacitances associated to their gate regions.

The local reference-generation architecture, illustrated schematically in FIG. 7 once again for the case of multilevel memory cells storing two bits, basically envisages that the three reference currents supplied to each of the sense amplifiers are directly generated by the reference generating circuit. This solution, albeit having a smaller bulk in so far as it does not entail current-mirror transistors, leads, however, during testing of the memory device, to long times for checking the references generated.

A further problem that adversely affects reading of multilevel memory cells is represented by the so-called "bending" of the voltage-current characteristics of the memory cells, this bending being in turn originated by the so-called "column path" created by the current of the memory cells being read.

In particular, in FIG. 8, a dashed line illustrates the ideal voltage-current characteristic of a memory cell, while a solid line illustrates the actual voltage-current characteristic of a memory cell, which has an evident bending downwards for high cell currents, being caused by the voltage drops on the column-selection transistors and possibly leading to an evident adverse effect on reading.

In order to minimize the voltage drops on the selection transistors, it is necessary for them to be very conductive, i.e., present a low electrical resistance, and this may be obtained only by using transistors of large size, which obviously occupy a large amount of silicon area.

The reading of multilevel memory cells is then strongly influenced by the precision and by the repeatability of the reading voltage supplied to the gate terminals of the memory cells during successive reading operations, the precision and repeatability depending to a marked extent upon the presence of ripple on the reading voltage ($V_{READ}$), the variation of the operating temperature of the memory device, the variation of the supply voltage supplied from outside the memory device, and any excessively close memory accesses.

Finally, reading of multilevel memory cells is also influenced by the gain spread of the memory cells due to process spreads, by the widening of the distributions of the drain currents $I_D$ caused by the gain variation of the multilevel memory cells, which is in turn caused by variations in the operating temperature ($T_1$ $T_2$) of the memory device, as shown in FIG. 9, and by the compression of the distributions of the drain currents $I_D$ of the multilevel memory cells caused by minimum-gain memory cells, as highlighted in FIG. 10.

SUMMARY OF THE INVENTION

One aim of the present invention is to provide a reading method for a nonvolatile memory device that overcomes at least in part the problems of known nonvolatile memory devices highlighted above comprising an array memory cell and a reference memory cell comprising biasing said array memory cell and said reference memory cell so as to modify their respective current-conduction states in different instants; and determining the contents of said array memory cell on the basis of the temporal relation existing between the instants when the current-conduction states of said array memory cell and of said reference memory cell are modified.

According to an embodiment of the present invention, said temporal relation is defined by the modification order of the current-conduction states of said array memory cell and said reference memory cell.

According to an embodiment of the present invention, said step of biasing said array memory cell and said reference memory cell comprises the step of:

applying a same reading voltage having a time-variable pattern to control terminals of said array memory cell and said reference memory cell.

According to an embodiment of the present invention, said reading voltage has a substantially ramp-like time pattern.

According to an embodiment of the present invention, said substantially ramp-like time pattern is increasing in time.

According to an embodiment of the present invention, said step of determining the contents of said array memory cell comprises the steps of comparing the cell current of said array memory cell and the reference current of said reference memory cell with a same comparison current, thereby generating a cell-latch signal and, respectively, a reference-latch signal containing information on the instants when said cell current and, respectively, said reference current satisfy a preset relation with said comparison current; and determining the contents of said array memory cell on the basis of the temporal relation between the instants when said cell current and said reference current satisfy said preset relation.

According to an embodiment of the present invention, said preset relation is defined by the condition that said cell current or said reference current exceeds said comparison current.

According to an embodiment of the present invention, said cell-latch signal and said reference-latch signal are logic type signals switching from a first to a second logic level when said cell current and, respectively, said reference current satisfy said preset relation.

According to an embodiment of the present invention, the method further comprises turning off said array memory cell and said reference memory cell immediately after said preset relation has been satisfied.

According to another embodiment, the present invention comprises a memory device comprising an array memory cell and a reference memory cell, comprising biasing means for biasing said array memory cell and said reference memory cell so as to modify their respective current-conduction states in different instants of time; and evaluation means for determining the contents of said array memory cell on the basis of the temporal relation existing between the instants when the current-conduction states of said array memory cell and of said reference memory cell are modified.

According to an embodiment of the present invention, said temporal relation is defined by the modification order of the current-conduction states of said array memory cell and of said reference memory cell.

According to an embodiment of the present invention, said biasing means comprises voltage-generating means for supplying control terminals of said array memory cell and of said reference memory cell with a same reading voltage having a time-variable pattern.

According to an embodiment of the present invention, said reading voltage presents a substantially ramp-like time pattern.

According to an embodiment of the present invention, said substantially ramp-like time pattern is increasing in time.

According to an embodiment of the present invention, said evaluation means comprises comparator means for comparing the cell current of said array memory cell and the reference current of said reference memory cell with a same comparison current, thereby generating a cell-latch signal and, respectively, a reference-latch signal containing information on the instants when said cell current and, respectively, said reference current satisfy a preset relation with said comparison current; and determination means for determining the contents of said array memory cell on the basis of the temporal relation between the instants when said cell current and said reference current satisfy said preset relation.

According to an embodiment of the present invention, said preset relation is defined by the condition that said cell current or said reference current exceed said comparison current.

According to an embodiment of the present invention, said cell-latch signal and said reference-latch signal are logic type signals switching from a first to a second logic level when said cell current and, respectively, said reference current satisfy said preset relation.

According to an embodiment of the present invention, the memory device further comprises turning-off means for turning off said array memory cell and said reference memory cell immediately after said preset relation has been satisfied.

According to an embodiment of the present invention, the memory device further comprises bus means for carrying said cell-latch and reference-latch signals.

BRIEF DESCRIPTION OF THE DRAWINGS

For a better understanding of the present invention a preferred embodiment thereof is now described purely by way of non-limiting example, with reference to the attached drawings, wherein.

DETAILED DESCRIPTION

Figure 1:
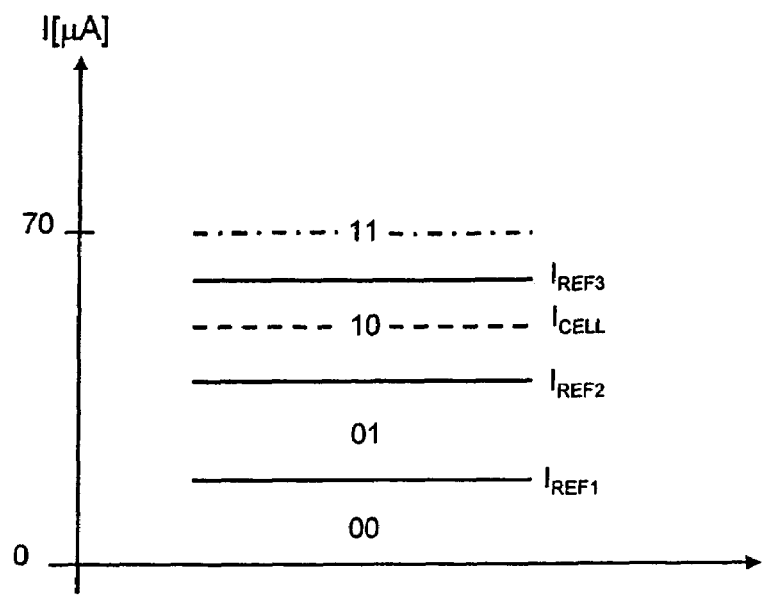
FIG. 1 is a graph representing the reference currents which define the ranges of values used for reading the contents of a two-bit memory cell.
Figure 2:
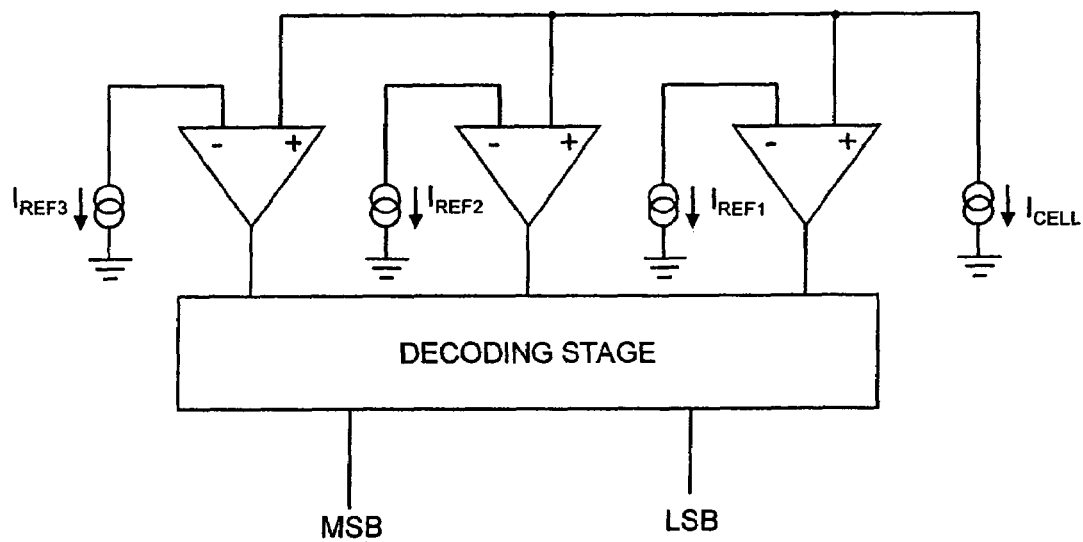
FIG. 2 illustrates the circuit architecture of a sense amplifier of parallel type for reading the contents of a two-bit memory cell.
Figures 3, 4:
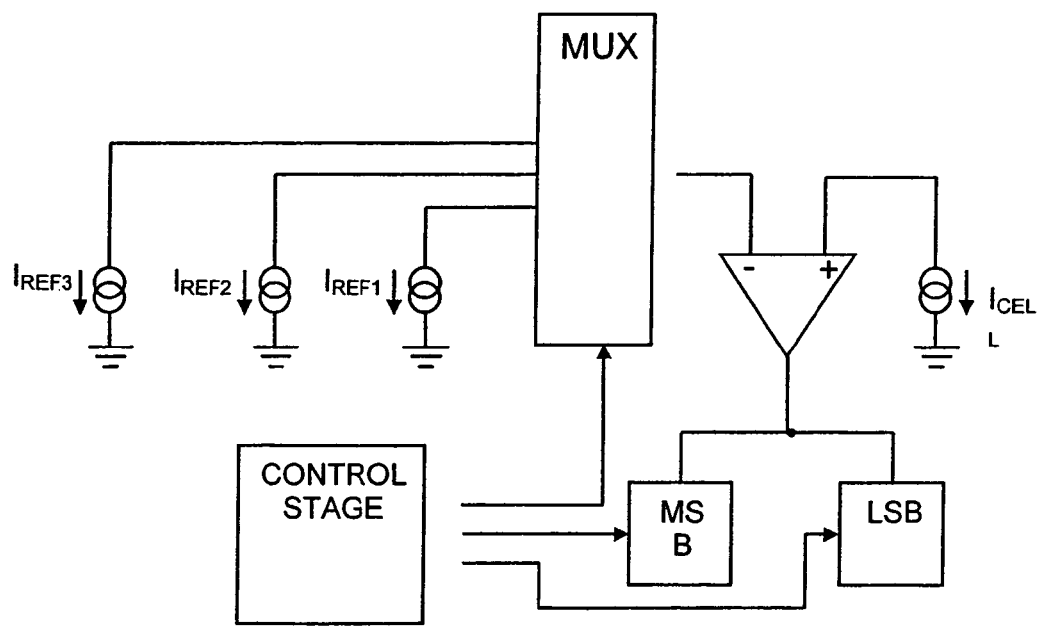
FIG. 3 is a schematic illustration of the dichotomic algorithm for reading the contents of a two-bit memory cell.
FIG. 4 illustrates the circuit architecture of a synchronous-serial-dichotomic sense amplifier for reading the contents of a two-bit memory cell.
Figure 5:
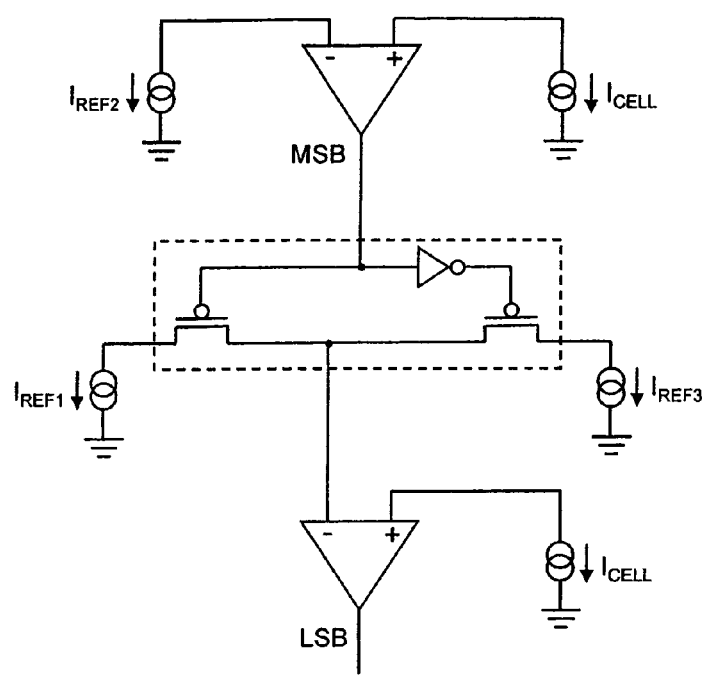
FIG. 5 illustrates the circuit architecture of an asynchronous-serial-dichotomic sense amplifier for reading the contents of a two-bit memory cell.
Figure 6:
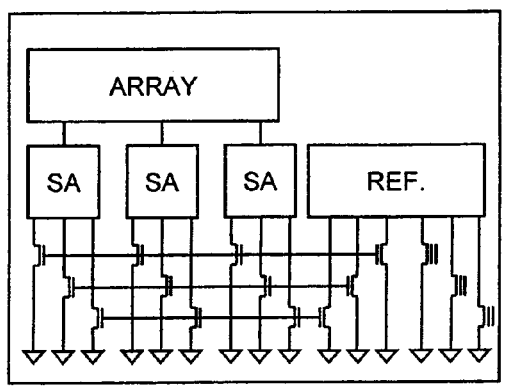
FIG. 6 illustrates an architecture for centralized generation of references.
Figure 7:
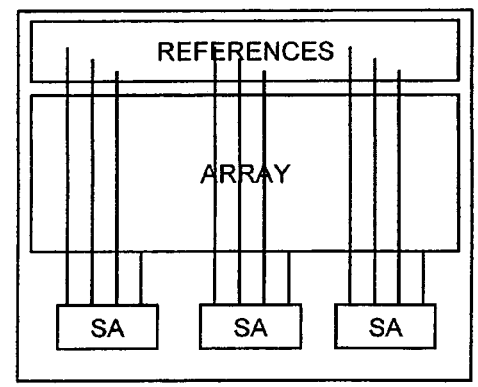
FIG. 7 illustrates an architecture for local generation of references.
Figure 8:
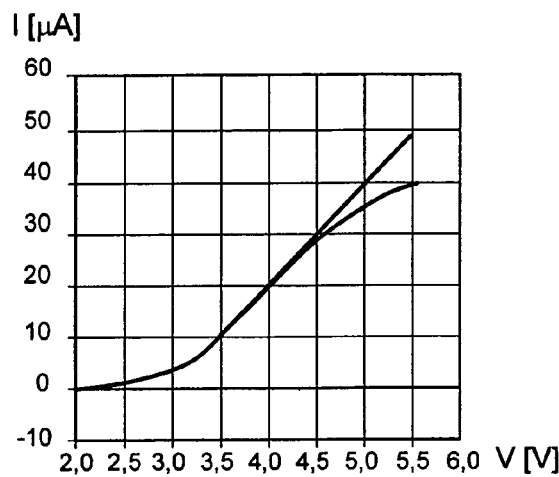
FIG. 8 illustrates the ideal and actual voltage-current characteristics of a memory cell.
Figure 9:
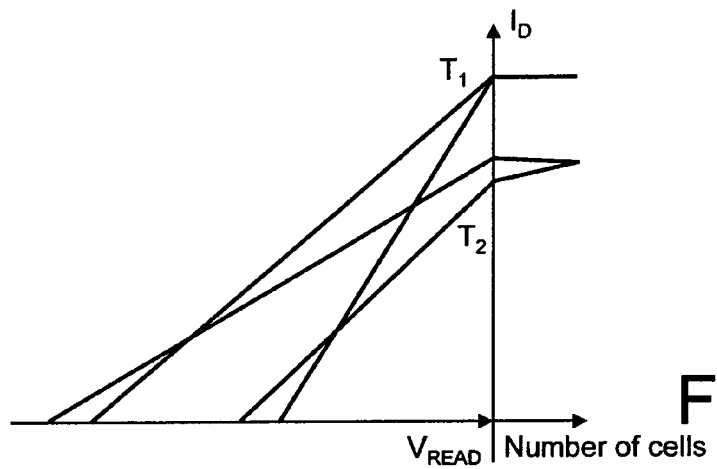
FIG. 9 illustrates the widening of the distributions of the drain currents caused by the gain variation of multilevel memory cells, in turn caused by the variation in the operating temperature of the memory device.
Figure 10:
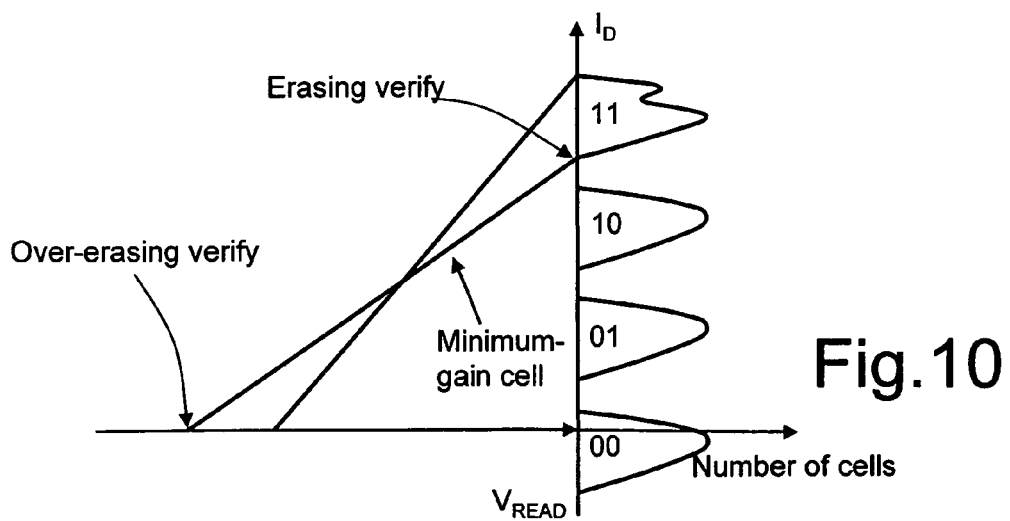
FIG. 10 illustrates the effect of compression of the distributions of the drain currents of multilevel memory cells caused by the minimum-gain memory cells.

Only in order to facilitate understanding, the present invention will be described hereinafter with reference to the reading the contents of multilevel memory cells which store two bits, i.e., memory cells in which the threshold voltage can assume four distinct levels, where, as described previously, the current of the array memory cell $I_{CELL}$ that it is intended to read is compared with three different reference currents $I_{REF1}$, $I_{REF2}$, $I_{REF3}$, which are generated by three distinct reference memory cells having three distinct threshold voltages.

Each time it will be indicated how what is described with regard to the specific example can be applied to memory cells to be read which store n bits, i.e., memory cells in which the threshold voltage can assume $2^n$ distinct values.

One innovative idea that underlies the present invention is that of:

biasing the array memory cell and the three reference memory cells so as to modify their respective current-conduction states in successive instants of time; and determining the contents of the array memory cell on the basis of the modification order of the current-conduction states of the array memory cell and of the three reference memory cells.

In particular, the present invention envisages:

applying to the gate terminals of the array memory cell and of the three reference memory cells a same reading voltage having a pattern that is variable in time, in particular a generally ramp-like pattern, i.e., a pattern which increases linearly with time from a minimum value, in particular zero, to a maximum value equal to the maximum reading voltage available within the memory device, so as to modify their current-conduction states in successive instants of time;

within the time window in which the reading voltage varies, comparing the current drained by the array memory cell and the currents drained by the three reference memory cells with a same comparison current of preset value, so as to generate four latch signals of a logic type, which each assume a first logic level, for example high, when the current is higher than the comparison current, and a second logic level, in the example considered a low logic level, when the current is lower than the comparison current; and determining the contents of the array memory cell according to the temporal relation existing between the switching instants of the four latch signals.

In greater detail, within the time window in which the reading voltage varies from the minimum value to the maximum value, the four triggering signals will switch in succession and in a given order, which depends upon the threshold voltages of the respective memory cells; in this case precisely the switching order of the triggering signals gives the information regarding the contents of the array memory cell.

To enable a better understanding of what has been described above in general terms, reference is made to FIGS. 11, 12 and 13, which respectively illustrate the distributions of the threshold voltages of memory cells associated to the memory of the four two-bit combinations "11", "10", "01" and "00", the currents $I_{CELL}$, $I_{REF1}$, $I_{REF2}$ and $I_{REF3}$ flowing in the array memory cell and in the three reference memory cells, and the comparison current $I_0$, and the latch signals $LATCH_{CELL}$, $LATCH_{REF1}$, $LATCH_{REF2}$ and $LATCH_{REF3}$ corresponding to the array memory cell and the three reference memory cells.

Figure 11:
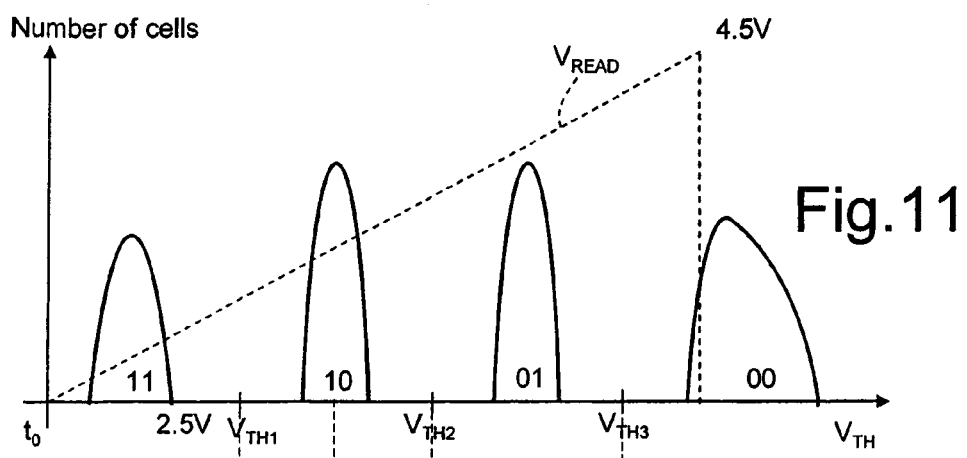
FIGS. 11–14 illustrate plots of electrical quantities of the memory device according to the present invention.

In FIG. 11, $V_{TH1}$, $V_{TH2}$ and $V_{TH3}$ indicate the threshold voltages of the reference memory cells (which, in practice, represent the voltage value of the three reference currents that define the four reference intervals initially described and used for reading a multilevel memory cell); furthermore the maximum value of the reading voltage $V_{READ}$ is shown.

Figure 12:
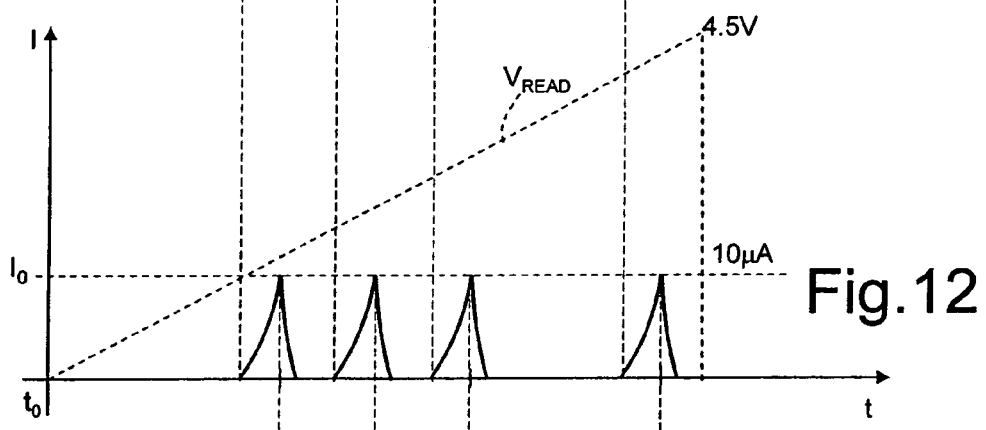
Figure 13:
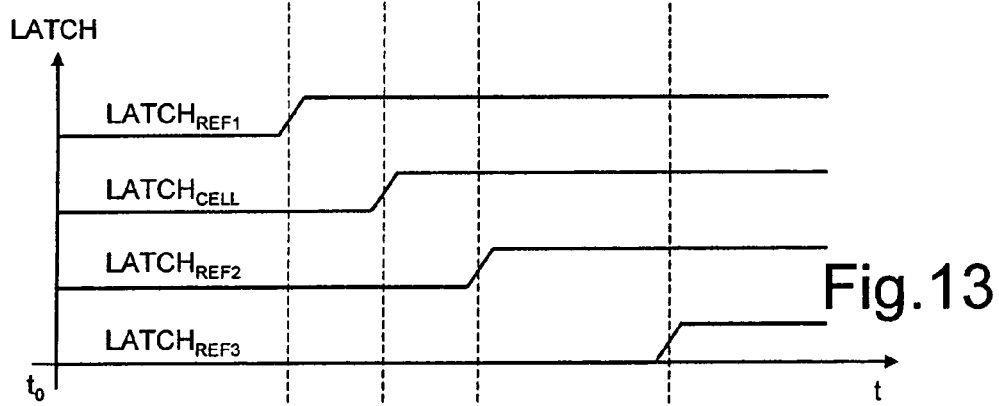

A dashed line in FIGS. 11 and 12 indicates the ramp pattern of the reading voltage $V_{READ}$.

Now assume that the contents of the array memory cell to be read is "10", i.e., the memory cell the contents whereof is to be read belongs to the distribution that is identified in FIG. 11 by "10" and is comprised in the range delimited by the threshold voltages $V_{TH1}$ and $V_{TH2}$.

Now assume applying to the gate terminals of the array memory cell and of the three reference memory cells a reading voltage $V_{READ}$ having the pattern shown in FIGS. 11 and 12.

As soon as the reading voltage $V_{READ}$ reaches the threshold voltage $V_{TH1}$, the first reference memory cell starts to conduct current and, when its current $I_{REF1}$ exceeds the reference current $I_0$, the corresponding reference-latch signal $LATCH_{REF1}$ switches from the low to the high logic level.

The same thing occurs then in succession in the array memory cell, in the second reference memory cell, and then in the third reference memory cell, so that the cell-latch signal $LATCH_{CELL}$, then the reference-latch signals $LATCH_{REF2}$ and $LATCH_{REF3}$ switch in succession.

It can thus readily be understood how, from an analysis of the temporal relation existing between the cell-latch signal $LATCH_{CELL}$ and the reference-latch signals $LATCH_{REF1}$, $LATCH_{REF2}$ and $LATCH_{REF3}$, it is possible to obtain, in a unique way, the contents of the array memory cell.

In the considered example, switching of the cell-latch signal $LATCH_{CELL}$ occurs in the interval of time elapsing between the switching of the reference-latch signal $LATCH_{REF1}$ and the switching of the reference-latch signal $LATCH_{REF2}$.

Given, however, that the switching of the reference-latch signal $LATCH_{REF1}$ is indicative of overstepping of the threshold voltage $V_{TH1}$ that represents the top end of the reference interval, within which the threshold voltages of the memory cells which store the bits "11" fall, while the switching of the reference-latch signal $LATCH_{REF2}$ is indicative of overstepping of the threshold voltage $V_{TH2}$ that represents the bottom end of the reference interval within which the threshold voltages of the memory cells which store the bits "10" fall, the switching of the cell-latch signal $LATCH_{CELL}$ that occurs between the switching of the reference-latch signal $LATCH_{REF1}$ and the switching of the reference-latch signal $LATCH_{REF2}$ is indicative of the fact that the array memory cell presents a threshold voltage comprised between the threshold voltage $V_{TH1}$ and the threshold voltage $V_{TH2}$ and hence stores the bits "10".

It will be immediately clear to the reader skilled in the art how the above description regarding the reading of two-bits multilevel memory cells can be applied as it is to the reading of multilevel memory cells which store any given number of bits.

It is moreover emphasized that a lack of switching of the cell-latch signal at the end of reading, means that the array memory cell that is being read belongs to the distribution indicated in FIG. 11 by "00".

According to a further aspect of the present invention, since reading of a multilevel memory cell performed in the way described above is essentially based upon information of a "temporal" type, i.e., on the analysis of the temporal relation existing between the switching instants of the $2^{n-1}$ latch signals, this type of information is well suited to being transported within the memory through a digital bus.

The information carried on the bus can alternatively be made up either of the reference-latch signals $LATCH_{REF1}$, $LATCH_{REF2}$ and $LATCH_{REF3}$ directly generated by the sense amplifiers, which will then be compared locally with the cell-latch signal $LATCH_{CELL}$ corresponding to the array memory cell being read, or else of a binary code obtained from processing the reference-latch signals $LATCH_{REF1}$, $LATCH_{REF2}$ and $LATCH_{REF3}$, the meaning of which will be clarified hereinafter.

Figure 15:
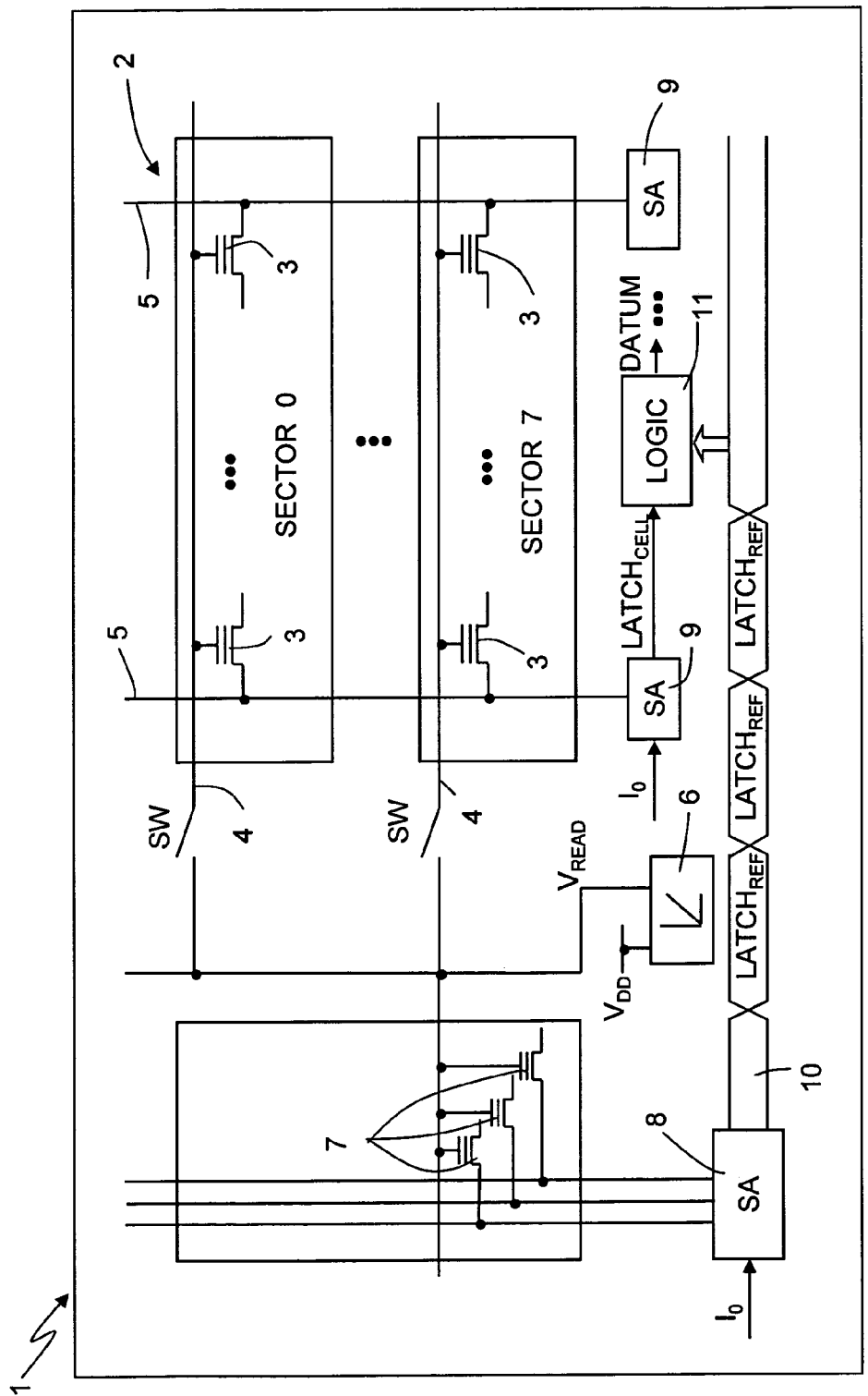
FIG. 15 illustrates a possible circuit architecture of the memory device according to the present invention.

FIG. 15 illustrates the circuit architecture of a nonvolatile memory device, wherein reading of multilevel memory cells storing each two bits is performed as above described and wherein the information carried on the bus includes the reference-latch signals $LATCH_{REF1}$, $LATCH_{REF2}$ and $LATCH_{REF3}$ directly generated by the sense amplifiers.

In particular, as may be noted from FIG. 15, the memory device, designated as a whole by 1 and shown only for the parts concerned in the present invention, comprises: a memory array 2 formed by array memory cells 3 arranged in rows and columns, in which wordlines 4 connect the gate terminals of the array memory cells 3 arranged on a same row and bitlines 5 connect the drain terminals of the array memory cells 3 arranged on a same column; a ramp generator 6, supplied with a voltage $V_X$ derived from the supply voltage $V_{DD}$ supplied from outside the memory device and outputting the ramp-like reading voltage $V_{READ}$ having the characteristics described above; three reference memory cells 7 having the threshold voltages $V_{TH1}$, $V_{TH2}$ and $V_{TH3}$ mentioned above; three sense amplifiers, represented schematically in FIG. 15 by a single block designated at 8, for comparing the reference currents $I_{REF1}$, $I_{REF2}$ and $I_{REF3}$ drained by the three reference memory cells 7 with the comparison current $I_0$, for example generated by a suitable current source (not illustrated), and for generating the three reference-latch signals $LATCH_{REF1}$, $LATCH_{REF2}$ and $LATCH_{REF3}$; a sense amplifier 9 for each bitline of the memory array 2 for comparing the cell current $I_{CELL}$ of the array memory cell 3 being read with the comparison current $I_0$ and thus generating the cell-latch signal $LATCH_{CELL}$; a bus 10 for carrying the three reference-latch signals $LATCH_{REF1}$, $LATCH_{REF2}$ and $LATCH_{REF3}$ within the memory array 2; and a logics 11 designed for determining, as above described, the contents of the array memory cell 3 being read on the basis of the temporal relation existing between the cell-latch signal $LATCH_{CELL}$ and the reference-latch signals $LATCH_{REF1}$, $LATCH_{REF2}$ and $LATCH_{REF3}$.

It will thus immediately be clear to the reader skilled in the art how what is illustrated in FIG. 15 with regard to the reading of memory cells that store two bits 10 each can be extended to the reading of memory cells that store n bits. In this case, in fact, it will be necessary to use $2^{n-1}$ reference memory cells 7 and $2^{n-1}$ sense amplifiers 8 for generating the reference-latch signals.

Figure 16:
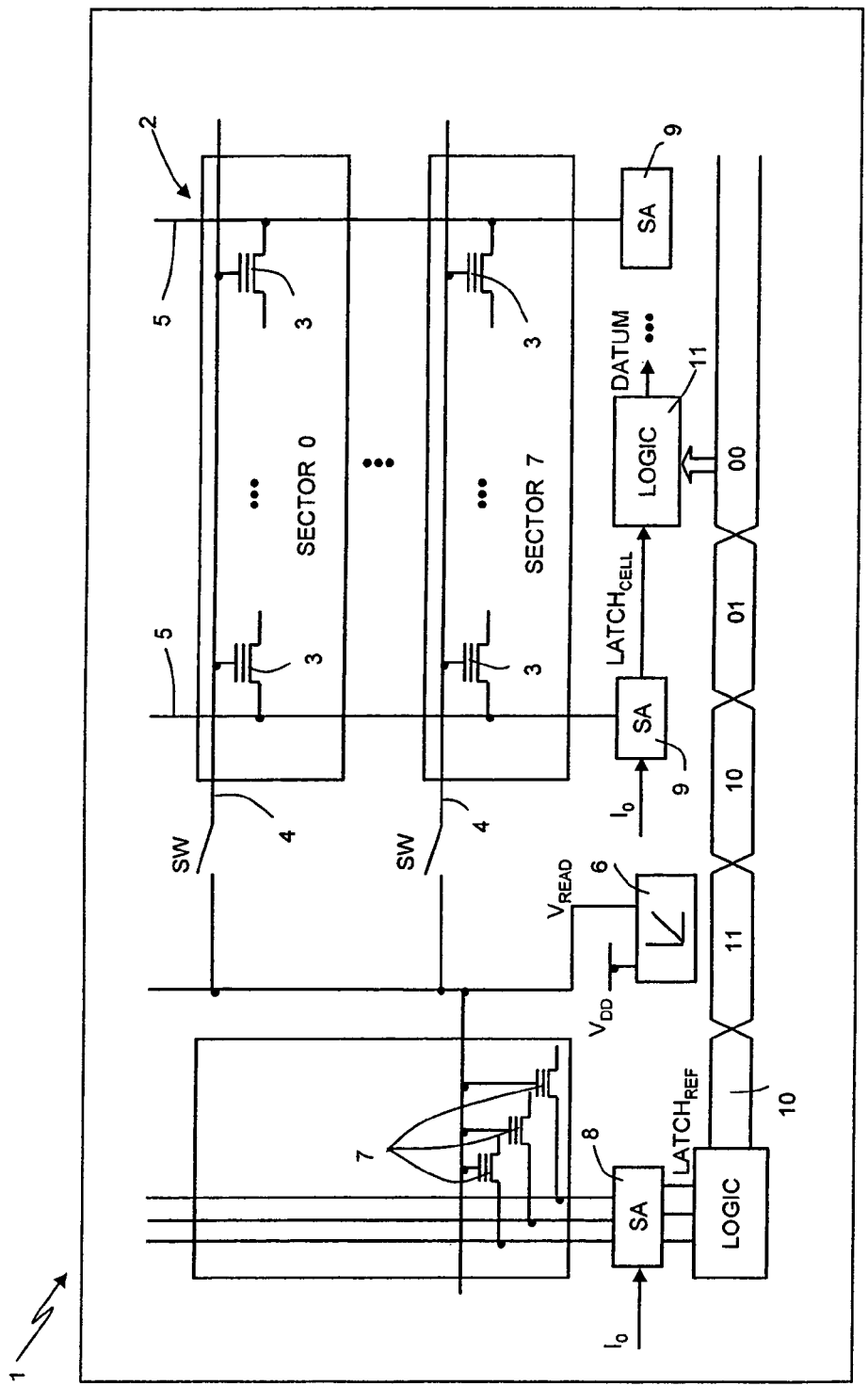
FIG. 16 illustrates a different circuit architecture of the memory device according to the present invention.

FIG. 16 illustrates the circuit architecture of a nonvolatile memory device wherein the reading of two-bit multilevel memory cells is performed according to the present invention and wherein the information carried on the bus is formed by a code obtained by processing the reference-latch signals $LATCH_{REF1}$, $LATCH_{REF2}$ and $LATCH_{REF3}$ generated by the sense amplifiers 8; the meaning of this code will now be clarified.

Assume that initially the bus 10 receives the two bits "11" associated with the first distribution of threshold voltages illustrated in FIG. 11, i.e., the two bits that are considered to be stored in the memory cells the threshold voltages of which are comprised in the range of reference threshold voltages delimited by the lowest reference threshold voltage, i.e., $V_{TH1}$, and by the immediately following reference threshold voltage, i.e., $V_{TH2}$.

Then, at each switching of one of the reference-latch signals $LATCH_{REF1}$, $LATCH_{REF2}$ and $LATCH_{REF3}$, the two bits sent on the bus 10 are modified in accordance with the variation of the two bits associated with the distributions of threshold voltages illustrated in FIG. 11, which is obtained as the reading voltage $V_{READ}$ increases, i.e., "11" is modified to "10", "01" and "00".

Figure 14:
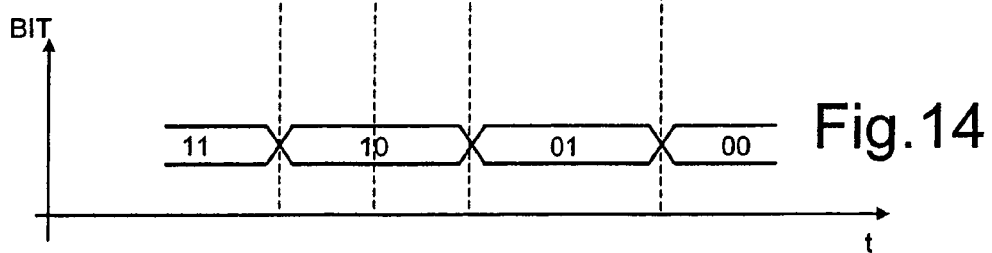

As is evident also from FIG. 14, the contents of the array memory cell 3 being read are simply the two bits ("11", "10", "01", and "00") present on the bus 10 when the cell-latch signal $LATCH_{CELL}$ switches, so that the switching of the cell-latch signal $LATCH_{CELL}$ may be used for storing the contents of the bus 10 at that time, and these contents constitute the datum stored in the array memory cell being read.

According to a further aspect of the present invention, once a latch signal has switched, whether this be the cell-latch signal or else a reference-latch signal, the memory cell that has originated said switching is turned off. This applies both for the array memory cells 3 and for the reference memory cells 7. This is clearly visible in FIG. 12, where, immediately after the currents of the memory cells have reached the reference value, they decrease rapidly to zero. Since, however, a reading voltage is applied to their gate terminals, the cell should be turned off by acting on the biasing of the drain terminal, in that the source terminal is generally grounded. This function is performed by the sense amplifiers, which, as known, in addition to recognizing the logic value stored in the memory cells, also correctly bias the drain terminals of the memory cells.

The turning-off of the memory cell after this has provided its own contribution to reading (temporal information represented by the time when the corresponding latch signal switches), together with a low comparison current, not only reduces the power consumption of the memory device, but above all considerably reduces the problem of raising the voltage on the source terminal, which causes the aforementioned apparent displacement of the distributions of the threshold voltages.

In addition, a small comparison current enables proportional reduction of the size of the column-selection transistors, with consequent reduction of the aforementioned bending of the voltage-current characteristics of the memory cells originated by the column path created by the current of the memory cells being read.

In addition, the true reading voltage is not the supply voltage $V_{DD}$ supplied from outside the memory device, but rather the voltage ramp generated by the ramp generator, so that any variation of the supply voltage is to some extent mitigated by the ramp generator, which, even though supplied by the supply voltage, derives therefrom only the current necessary for generating the ramp on the wordlines, attenuating the noise present on its supply.

As regards, instead, the problems linked to the gain spread of the memory cells and by the compression of the distributions of the threshold voltages of the memory cells due to minimum-gain memory cells, such problems are completely eliminated with the use of the present invention, provided that the minimum-gain memory cell is capable of reaching the comparison current $I_0$.

As regards, instead, the problems of the gain variations of the memory cells due to the variation of the operating temperature of the memory device, these are considerably reduced since the involved currents are relatively low, and moreover reading is a threshold reading and not a current reading.

Finally, it is clear that modifications and variations may be made to what has been described and illustrated herein, without thereby departing from the scope of the present invention, as defined in the attached claims.

In particular, it is emphasized that the concepts of the present invention may be applied to the reading of memory cells which store any number of bits, even just one. In this latter case, in fact, the contents of the array memory cell can be established simply on the basis of which, between the array memory cell and the reference memory cell, first starts conducting.

Furthermore, the reading voltage could have a ramp pattern opposite to the one described and illustrated in the figures, namely, a ramp pattern which decreases linearly in time from a maximum to a minimum value. In this case, the information regarding the contents of the array memory cell would reside in the switch-off order of the array and reference memory cell or cells. Moreover, with this choice, both the array memory cell and the reference memory cells would all start conducting and would turn off one at a time, thereby losing the advantages linked to the possibility of turning off the conducting memory cell as soon as this has provided its contribution to reading, namely, saving of current and eliminating the apparent displacement of the distributions of the threshold voltages.

In addition, the reading voltage could even have a pattern different from the ramp-like one described and illustrated in the figures, namely, a pattern that is generically variable in time, for example a staircase pattern or else a generically curvilinear pattern that increase or decrease in time.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. A reading method for a memory device comprising an array memory cell and a reference memory cell comprising:
   biasing said array memory cell and said reference memory cell so as to modify their respective current-conduction states in different instants; and
   determining contents of said array memory cell on a basis of the temporal relation existing between the instants when the current-conduction states of said array memory cell and of said reference memory cell are modified.

2. The reading method according to claim 1, wherein said temporal relation is defined by a modification order of the current-conduction states of said array memory cell and said reference memory cell.

3. The reading method according to claim 1, wherein said step of biasing said array memory cell and said reference memory cell comprises the step of:
   applying a same reading voltage having a time-variable pattern to control terminals of said array memory cell and said reference memory cell.

4. The reading method according to claim 3, wherein said reading voltage has a substantially ramp-like time pattern.

5. The reading method according to claim 4, wherein said substantially ramp-like time pattern is increasing in time.

6. The reading method according to claim 1, wherein said step of determining the contents of said array memory cell comprises the step of:
   comparing a cell current of said array memory cell and a reference current of said reference memory cell with a same comparison current, thereby generating a cell-latch signal and, respectively, a reference-latch signal containing information on the instants when said cell current and, respectively, said reference current satisfy a preset relation with said comparison current; and
   determining the contents of said array memory cell on the basis of the temporal relation between the instants when said cell current and said reference current satisfy said preset relation.

7. The reading method according to claim 6, wherein said preset relation is defined by a condition that said cell current or said reference current exceeds said comparison current.

8. The reading method according to claim 6, wherein said cell-latch signal and said reference-latch signal are logic type signals switching from a first to a second logic level when said cell current and, respectively, said reference current satisfy said preset relation.

9. The reading method according to claim 6, further comprising turning off said array memory cell and said reference memory cell immediately after said preset relation has been satisfied.

10. A memory device comprising an array memory cell and a reference memory cell, comprising:
    biasing means for biasing said array memory cell and said reference memory cell so as to modify their respective current-conduction states in different instants of time; and
    evaluation means for determining contents of said array memory cell on a basis of the temporal relation existing between the instants when the current-conduction states of said array memory cell and of said reference memory cell are modified.

11. The memory device according to claim 10, wherein said temporal relation is defined by the modification order of the current-conduction states of said array memory cell and of said reference memory cell.

12. The memory device according to claim 10, wherein said biasing means comprises:
    voltage-generating means for supplying control terminals of said array memory cell and of said reference memory cell with a same reading voltage having a time-variable pattern.

13. The memory device according to claim 12, wherein said reading voltage presents a substantially ramp-like time pattern.

14. The memory device according to claim 13, wherein said substantially ramp-like time pattern is increasing in time.

15. The memory device according to claim 10, wherein said evaluation means comprises:
    comparator means for comparing a cell current of said array memory cell and a reference current of said reference memory cell with a same comparison current, thereby generating a cell-latch signal and, respectively, a reference-latch signal containing information on the instants when said cell current and, respectively, said reference current satisfy a preset relation with said comparison current; and
    determination means for determining the contents of said array memory cell on the basis of the temporal relation between the instants when said cell current and said reference current satisfy said preset relation.

16. The memory device according to claim 15, wherein said preset relation is defined by the condition that said cell current or said reference current exceed said comparison current.

17. The memory device according to claim 15, wherein said cell-latch signal and said reference-latch signal are logic type signals switching from a first to a second logic level when said cell current and, respectively, said reference current satisfy said preset relation.

18. The memory device according to claim 15, further comprising turning-off means for turning off said array memory cell and said reference memory cell immediately after said preset relation has been satisfied.

19. The memory device according to claim 15, further comprising bus means for carrying said cell-latch and reference-latch signals.

* * * * *